United States Patent
Koui et al.

(10) Patent No.: US 7,525,772 B2
(45) Date of Patent: Apr. 28, 2009

(54) MAGNETORESISTIVE DEVICE, MAGNETIC REPRODUCING HEAD, AND MAGNETIC INFORMATION REPRODUCING APPARATUS

(75) Inventors: Katsuhiko Koui, Tokyo (JP); Kohichi Tateyama, Sapporo (JP); Takashi Tateyama, legal representative, Sapporo (JP); Tomomi Funayama, Tokyo (JP); Koichi Kubo, Tokyo (JP); Hitoshi Iwasaki, Tokyo (JP); Hideaki Fukuzawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 504 days.

(21) Appl. No.: 11/370,185

(22) Filed: Mar. 8, 2006

(65) Prior Publication Data

US 2006/0209472 A1    Sep. 21, 2006

(30) Foreign Application Priority Data

Mar. 16, 2005    (JP)    ............................. 2005-075140

(51) Int. Cl.
*G11B 5/39*    (2006.01)
(52) U.S. Cl. .................................................. 360/324.1
(58) Field of Classification Search ....... 360/324–324.2
See application file for complete search history.

(56) References Cited

U.S. PATENT DOCUMENTS

| | | | |
|---|---|---|---|
| 6,987,650 B2 | 1/2006 | Liu et al. | |
| 2003/0104249 A1* | 6/2003 | Okuno et al. | ................ 428/693 |
| 2004/0169963 A1* | 9/2004 | Okuno et al. | ............ 360/324.1 |
| 2004/0233584 A1 | 11/2004 | Liu et al. | |
| 2004/0246631 A1* | 12/2004 | Dieny et al. | ............... 360/324.1 |
| 2005/0042478 A1* | 2/2005 | Okuno et al. | .......... 428/694 TM |
| 2005/0094327 A1* | 5/2005 | Okuno et al. | ............. 360/324.2 |
| 2005/0141147 A1 | 6/2005 | Sbiaa et al. | |
| 2005/0157433 A1* | 7/2005 | Kamiguchi et al. | ....... 360/324.1 |

FOREIGN PATENT DOCUMENTS

| | | |
|---|---|---|
| JP | 06-060335 | 3/1994 |
| JP | 2002-208744 | 7/2002 |
| JP | 2004-214251 | 7/2004 |
| JP | 2004-349708 | 12/2004 |
| JP | 2005-019484 | 1/2005 |
| JP | 2005-191101 | 7/2005 |

OTHER PUBLICATIONS

U.S. Appl. No. 10/400,638, filed Mar. 28, 2003.
U.S. Appl. No. 10/985,886, filed Nov. 12, 2004.

(Continued)

*Primary Examiner*—William J Klimowicz
(74) *Attorney, Agent, or Firm*—Nixon & Vanderhye, PC

(57) ABSTRACT

A magnetoresistive device includes a magnetoresistive film and a pair of electrodes for applying a sense current substantially perpendicularly to the magnetoresistive film. The magnetoresistive film includes a magnetization pinned film including a first ferromagnetic layer having a magnetization direction substantially pinned in one direction, a magnetization free film including a second ferromagnetic layer whose magnetization direction changes in accordance with an external magnetic field applied thereto, an intermediate layer formed between the magnetization pinned film and the magnetization free film and having an insulating film and a metal conduction portion extending in the film thickness direction of the insulating film, and a layer containing an electrovalent or covalent compound formed near the metal conduction portion.

11 Claims, 5 Drawing Sheets

OTHER PUBLICATIONS

Dieny et al. *Magnetotransport properties of magnetically soft spin-valve structures* (invited), J. Appl. Phys. 69 (8), Apr. 15, 1991, pp. 4774-4779.

Office Action in Japanese Application No. 2005/075,140, dated Jan. 13, 2009, and English-language translation thereof.

* cited by examiner

MAGNETORESISTIVE DEVICE, MAGNETIC REPRODUCING HEAD, AND MAGNETIC INFORMATION REPRODUCING APPARATUS

RELATED APPLICATION(S)

The present disclosure relates to the subject matter contained in Japanese Patent Application No. 2005-075140 filed on Mar. 16, 2005, which is incorporated herein by reference in its entirety.

FIELD

The present invention relates to a magnetoresistive device whose electric resistance changes in accordance with a magnetic field applied thereto, and a magnetic reproducing head and a magnetic information reproducing apparatus using the magnetoresistive device.

BACKGROUND

In recent years, in an information recording/storing apparatus such as a hard disk unit, the magnetic recording density has been made higher. There has increased a request for a highly sensitive and high S/N ratio magnetoresistive device in which a high rate of change of resistance can be obtained in a low magnetic field. The "highly sensitive" means that a resistance change ($\Omega$) per unit magnetic field (Oe) is large. As the magnetoresistive device has a larger magnetoresistive (MR) change and is more excellent in soft magnetic characteristic, the magnetoresistive device becomes more sensitive. In addition, in order to obtain a high S/N ratio, it is important to make the thermal noise as low as possible, and to improve the frequency response. It is therefore undesired that the device resistance becomes large. When the magnetoresistive device is used for a hard disk unit, it is preferable that the device resistance is a value of about 5 $\Omega$ to 30 $\Omega$.

A magnetoresistive film such as a spin valve film has been known as the magnetoresistive film. The spin valve film has a configuration in which a ferromagnetic layer, a non-magnetic layer, a ferromagnetic layer and an antiferromagnetic layer are laminated in this order. In one of the ferromagnetic layers, magnetization is pinned by exchange bias or the like using the antiferromagnetic layer in advance. The other ferromagnetic layer is formed so that the magnetization can be rotated easily by an external magnetic field (signal magnetic field or the like). When only the magnetization of the other ferromagnetic layer is rotated by an external magnetic field, the relative angle between the magnetization directions of the two ferromagnetic layers is changed so that a large magnetoresistive effect can be obtained. This is described in the document "Appl. Phys. Vol. 69, 4774 (1991)".

A ferromagnetic layer whose magnetization rotates easily in accordance with an external magnetic field is generally called "magnetization free layer", "magnetic field sensitive layer", "magnetization free layer", or the like. On the other hand, a ferromagnetic layer whose magnetization is fixed is called "pin layer", "magnetization pinned layer", or the like. A non-magnetic layer is called "spacer layer", "interface adjustment intermediate layer", "intermediate layer", or the like.

A CPP (Current-Perpendicular to Plane) system in which a current is applied to a magnetoresistive film perpendicularly is expected to have a higher MR change rate than a CIP (Current-In-Plane) system in which a current is applied into a film surface of a magnetoresistive device. Particularly in order to attain information playback at a high recording density over 100 Gbit/inch$^2$, the device size is about 0.1 micron square. In this event, in the CIP system, it is difficult to secure a satisfactory S/N ratio due to a problem such as increase in resistance or heating. In order to overcome this, a value over 30% is required as the MR change rate.

A tunneling magnetoresistive (TMR) film has been known as a magnetoresistive film having an MR change rate over 20%. In the TMR film, a tunneling film is used as the intermediate layer of the spin valve film, and a current is applied perpendicularly to the TMR film surface. However, due to the resistance of the TMR film reaching a value of about 100 $\Omega$ or more, frequency response property required for reading a signal cannot be obtained. In addition, shot noise increases so that the S/N ratio cannot be improved.

According to the CCP spin valve, the resistance can be suppressed to be low because the intermediate layer is of metal. In addition, all the current passes through the interface between the ferromagnetic layer and the intermediate layer. Accordingly, the MR effect can be enhanced. However, in this structure, the resistance is too low to secure a required output voltage. In addition, due to a high ratio of parasitic resistance, MR observed in the device is several percentages in spite of the large MR effect. In order to solve these problems, there has been proposed a current-confined CCP spin valve using an insulating layer (current confinement layer) in which a metal conduction path is formed (see JP-A-2002-208744). When an insulating layer in which a metal conduction path is formed in or near an intermediate layer where a magnetoresistive effect appears, the resistance of a region contributing to MR can be made larger than the parasitic resistance. As a result, the MR value in the device can be increased, while the resistance can be adjusted to improve an output V (V=MR×"resistance R"×"sense current I").

In the current-confined-path CPP spin valve, a microscopic metal conduction path (metal path) is used. The microscopic metal path is apt to be affected by electro-migration (EM), and the resistance is apt to increase locally so as to heat locally and lead to elementary thermal diffusion. Therefore, it is a problem to obtain long-term reliability.

SUMMARY

The present invention is directed to a magnetoresistive device or the like in which thermal stability of a current-confined-path CPP spin valve is improved so that long-term reliability can be secured.

According to a first aspect of the invention, there is provided a magnetoresistive device including: a magnetoresistive film; and a pair of electrodes electrically connected to upper and lower film surfaces of the magnetoresistive film. The magnetoresistive film includes: a magnetization pinned film including a first ferromagnetic layer having magnetization substantially pinned in one direction; a magnetization free film including a second ferromagnetic layer whose magnetization rotates in accordance with an external magnetic field; an intermediate layer formed between the magnetization pinned film and the magnetization free film; and a compound layer that is formed between the metal conduction portion and at least one of the magnetization pinned film and the magnetization free film, the compound layer including a compound having at least one of an electrovalent-bound characteristic and a covalently-bound characteristic. The intermediate layer includes: an insulating film, and a columnar metal conduction portion formed within the insulating film to provide electrical conductivity between the magnetization pinned film and the magnetization free film.

According to a second aspect of the invention, there is provided a magnetic reproducing head including: a head slider that includes a surface that faces a recording medium; and the magnetoresistive device provided on the surface of the head slider to reproduce information recorded on the recording medium.

According to a third aspect of the invention, there is provided a magnetic information reproducing apparatus including: a information recording medium on which magnetic information is recorded; and a magnetic reproducing head that reproduces the magnetic information recorded on the information recording medium. The magnetic reproducing head includes: a head slider that includes a surface that faces a recording medium; and the magnetoresistive device provided on the surface of the head slider to reproduce information recorded on the recording medium.

DETAILED DESCRIPTION OF THE EMBODIMENTS

Figure 1:
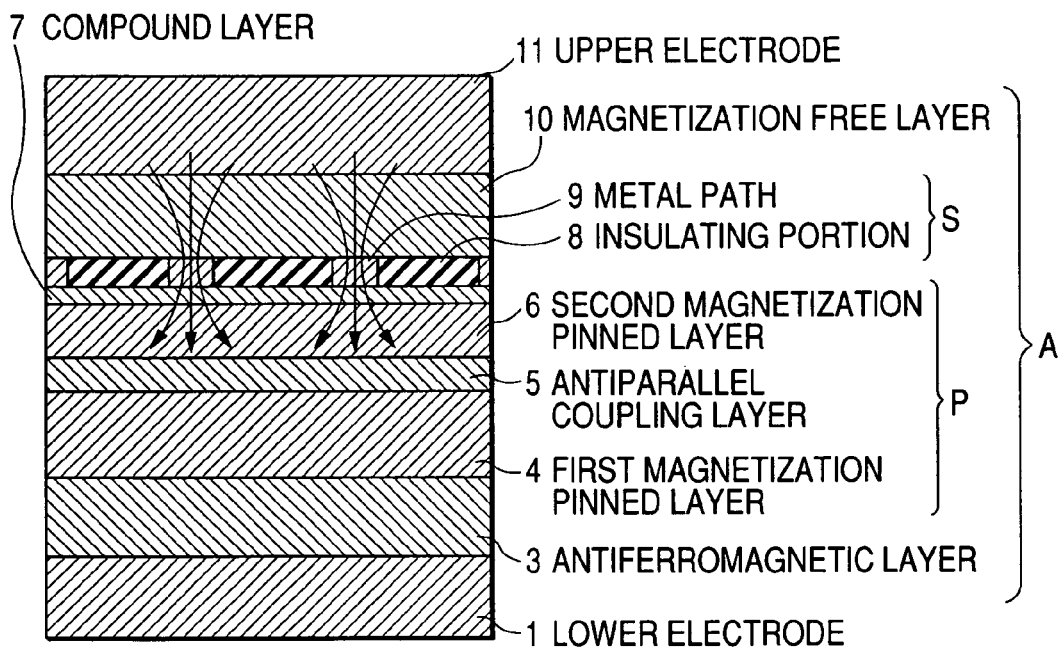
FIG. 1 is a schematic sectional view for explaining a magnetoresistive device according to a first embodiment.

Referring now to the accompanying drawings, there are shown preferred embodiments of the invention. In the following description, parts common among embodiments or examples are denoted by the same reference numerals correspondingly, and redundant description will be avoided. Respective diagrams to be referred to are schematic diagrams for explaining the invention and promoting understanding of the invention. For the sake of convenience of illustration in the drawings, there may be differences in shape, size, ratio, etc. from a real apparatus. These differences may be changed on design suitably in consideration of the following description and the known techniques.

First Embodiment

A magnetoresistive device according to a first embodiment will be described with reference to the sectional schematic view of FIG. 1.

The magnetoresistive device has a magnetoresistive film A, and a pair of electrodes (lower electrode 1 and upper electrode 11) for supplying a sense current to the magnetoresistive film A. In this embodiment, the lower electrode 1, the magnetoresistive film A and the upper electrode 11 prepared respectively are laminated and formed in turn on a substrate.

The magnetoresistive film has an antiferromagnetic layer 3, a magnetization pinned film P (including a first magnetization pinned layer 4, an antiparallel coupling layer 5 and a second magnetization pinned layer 6), a compound layer 7, an intermediate layer (spacer layer) S including an insulating portion 8 and a metal path 9, and a magnetization free layer 10. The first and second magnetization pinned layers 4 and 6 and the magnetization free layer 10 are made of ferromagnetic materials as will be described later.

The magnetization pinned film P has magnetization pinned in a predetermined direction. The magnetization of the first magnetization pinned layer 4 is pinned by exchange coupling with the antiferromagnetic layer 3. The magnetization of the first magnetization pinned layer 4 may be pinned not by use of exchange coupling with the antiferromagnetic layer 3 but by use of another method such as a method using a leakage magnetic field from a hard magnetic substance.

The first and second magnetization pinned layers 4 and 6 are magnetically coupled in antiparallel with each other through the antiparallel coupling layer 5 made of a non-magnetic material having a predetermined thickness. The second magnetization pinned layer 6 has magnetization antiparallel with the magnetization of the first magnetization pinned layer 4. The magnetization pinned film P may be formed not out of the laminated configuration as shown in FIG. 1 but out of a single ferromagnetic layer, a lamination of a plurality of ferromagnetic layers different in material or composition, or a lamination of a ferromagnetic layer and a non-magnetic layer.

It is desired that an alloy layer containing Fe, Co or Ni as its main component is used as the first and second magnetization pinned layers 4 and 6. The materials or composition ratios of the first and second magnetization pinned layers 4 and 6 may be made the same or different.

The optimal alloy composition of the first magnetization pinned layer 4 differs in accordance with the material of the antiferromagnetic layer 3 or a hard magnetic layer on which the first magnetization pinned layer 4 should be laminated. When an antiferromagnetic Mn substance such as PtMn, IrMn, RhMn or RuMn is used as the antiferromagnetic layer, it is desired that the first magnetization pinned layer 4 is of an alloy of CoFe. When a hard magnetic material is used, a hard magnetic material may be used as the first magnetization pinned layer 4. An alloy of CoPt, FePt or the like may be used as the hard magnetic material.

Rh, Ru, Ir, etc. may be used as the antiparallel coupling layer 5. The thickness of the antiparallel coupling layer 5 may be selected suitably within a range of from about 0.3 nm to about 1 nm so as to optimize the antiparallel coupling force.

It is desired that an alloy layer including at least one selected from Fe, Co and Ni is used as the second magnetization pinned layer 6. Particularly an alloy layer containing Fe as its main component can obtain high MR. Further, a structure in which a non-magnetic substance Cu, Au, Ag, Pt, Pd or Os is inserted into the aforementioned magnetic layer can enhance the magnetoresistive effect. It is desired that the film thickness to be inserted is in a range of from about 0.1 nm to about 0.5 nm.

Half metal may be used as the second magnetization pinned layer 6. In half metal, electrons are substantially perfectly spin-polarized. Accordingly, a high magnetoresistive effect can be obtained. Specifically, spinel, a Heusler alloy containing Co as its main component, etc. can be used.

In order to obtain a sufficient magnetoresistive effect, it is desired to make the film thickness of the magnetization pinned layer 6 not thinner than about 1 nm. Further, when the film thickness of the magnetization pinned layer 6 is not thinner than about 3 nm, a higher magnetoresistive effect can be obtained.

The magnetization free layer 10 has predetermined magnetization in a zero magnetic field where no external magnetic field is applied. The magnetization of the magnetization free layer 10 rotates in accordance with an external magnetic field applied thereto. A ferromagnetic material having a smaller coercive force than the magnetization pinned layers 4 and 6 so that magnetization of the ferromagnetic material is changed by an external magnetic field can be used as the material of the magnetization free layer 10.

In order to attain high sensitivity, it is preferable that the pinned magnetization direction of the magnetization pinned film P is substantially perpendicular to the magnetization direction of the magnetization free layer 10 in the zero magnetic field (to form a so-called spin valve type magnetoresistive device). In addition, the magnetization free layer 10 may be a lamination of two or more ferromagnetic material layers or a lamination of ferromagnetic material layers and non-magnetic material layers laminated alternately.

A ferromagnetic alloy including at least one selected from Co, Fe and Ni or a lamination of a Co alloy and an Ni alloy can be used as the material of the magnetization free layer 10. A structure in which a non-magnetic substance Cu, Au, Ag or Pd is inserted between these alloy layers may be used. Half metal may be used as the material of the magnetization free layer 10.

The film thickness of the magnetization free layer 10 is decided in accordance with required sensitivity. For example, for a head of a hard disk drive, the thickness can be designed in a range of about 1 nm to about 10 nm.

The intermediate layer S has an insulating portion 8 formed to be lamellar, and a columnar metal path (example of a metal conduction portion) 9 penetrating the insulating portion 8 vertically. The metal path 9 of the intermediate layer S forms a metal current path and serves for electric continuity between the magnetization pinned film P and the magnetization free layer 10. On the other hand, no current flows into the insulating portion 8 of the intermediate layer S. Therefore, the path of the sense current is confined in the intermediate layer S as shown by the arrows in FIG. 1 illustrating the concept of the narrowed path. The intermediate layer S in the first embodiment serves for current confinement in this device.

The ratio of the metal path 9 occupying the intermediate layer S is preferably not higher than about 50% of the film surface of the intermediate layer S. When the ratio of the insulating portion 8 reaches about 50% or more, increase in magnetoresistive effect can be expected due to the current-confinement.

Various metals can be used as the material of the metal path 9. It is preferable that the metal path 9 is formed out of metal having one or more kinds of materials selected from Cu, Au, Ag, Pt, Pd and Os as its main components. The insulating portion 8 of the intermediate layer S is formed out of oxide, nitride, boride, chloride or carbide having at least one selected from Ta, W, Nb, Al, Mo, P, V, As, Sb, Zr, Ti, Zn, Pb, Th, Be, Cd, Sc, La, Y, Pr, Cr, Sn, Ga, Cu, In, Rh, Pd, Mg, Li, Ba, Ca, Sr, Mn, Fe, Co, Ni and Rb as its main component.

It is preferable that the intermediate layer S is thick enough to minimize magnetic coupling between the upper and lower magnetic layers P and 10. When the magnetic coupling between the upper and lower magnetic layers P and 10 is small like this, mutual interference between the pinned magnetization of the magnetization pinned film P and the free magnetization of the magnetization free layer 10 can be suppressed.

In current-confined-path CPP spin valves configured thus, the current path using the metal path S is microscopic. In some current-confined-path CPP spin valves, the path may be about 5 nm in diameter. It is preferable to use metal for such a microscopic path in order to enhance MR. However, the microscopic metal path is easily affected by electro-migration (EM), and the resistance increases partially so as to cause local heating to thereby lead to elementary thermal diffusion easily. It is therefore difficult to obtain long-term reliability required as a product.

Therefore, in such a current-confined-path CPP spin valve, the compound layer 7 is laminated to the metal path 9 directly or through another layer. When the compound layer 7 is formed thus, it is possible to suppress elementary diffusion in the interface between the metal path 9 and the magnetic layer (layer 6 in FIG. 1).

Materials expected to have the effect of suppressing elementary diffusion are compounds having at least one of an electrovalent-bound characteristic and a covalently-bound characteristic, such as oxides, nitrides, fluorides, borides, carbides, etc. These compounds can be categorized into three kinds, that is, insulators, semiconductors and metals from the point of view of conductivity. Since the current-confined-path CPP spin valve is required to have an ohmic characteristic and a reduced resistance, it is not possible to use any insulator. Therefore, materials available for the compound layer 7 are semiconductors, half metals and metals which can form ohmic junction with the metal path 9, the magnetic layer 6 or the like adjacent thereto directly or through another layer. Specifically, III-V semiconductors, II-VI semiconductors, or oxide semiconductors containing Fe, Cu, In, W, Ti, Pb, V, Bi, Nb, Zn, Ta, Sn, Zr, etc. can be used as the material of the compound layer 7.

Examples of materials which show conductivity as semiconductors and are available as the compound layer 7 include GaAs, GaN, AlAs, AlN, CdS, ZnS, CdSe, ZnSe, $Fe_2O_3$, $Cu_2O$, $In_2O_3$, $WO_3$, $Fe_2TiO_3$, PbO, $V_2O_5$, $FeTiO_3$, $Bi_2O_3$, $Nb_2O_3$, $TiO_2$, $SrTiO_3$, ZnO, $BaTiO_3$, $KTaO_3$, $SnO_2$, $ZrO_2$, etc. Particularly, oxide semiconductors having strong covalency are effective in preventing diffusion.

Examples of materials which show conductivity as n-type semiconductors and are available as the compound layer 7 include $Fe_2O_3$, $In_2O_3$, $WO_3$, $Fe_2TiO_3$, PbO, $V_2O_5$, $FeTiO_3$, $Bi_2O_3$, $Nb_2O_3$, $TiO_2$, $SrTiO_3$, ZnO, $BaTiO_3$, $KTaO_3$, $SnO_2$, $ZrO_2$, etc. These examples show an n-type characteristic and are inexpensive. Particularly, $Fe_2O_3$, $In_2O_3$, $WO_3$, $Fe_2TiO_3$, PbO, $V_2O_5$, $FeTiO_3$, $Bi_2O_3$, $Nb_2O_3$, $TiO_2$, ZnO, $SnO_2$ and $ZrO_2$ can be produced by oxidation treatment after a parent material is formed. Thus, a lower layer is hardly damaged at the time of producing.

When a semiconductor material is used as the compound layer 7, it is preferable that about 1% or more of impurities are added to the semiconductor material so as to obtain an ohmic junction with adjacent layers and thereby prevent a Schottky barrier or the like from being formed. Alternatively, when the film thickness of the compound layer 7 is made not thicker than about 10 nm, the barrier is so small that the layer practically shows an ohmic characteristic. However, resistance in semiconductor is apt to be higher than that in metal. In order to set the final device resistance at a proper value, for example, as a head of an HDD, it is preferable that the film thickness of the compound layer 7 is made not thicker than about 5 nm. Further, it is desired that about 1% or more of impurities are added to the semiconductor in order to reduce the resistance of the semiconductor.

In order to obtain the ohmic characteristic, it is necessary to reduce the film thickness of the compound layer 7 with the increase of gap energy. It is therefore necessary to form a layer of II-VI semiconductor to be thinner than a layer of III-V semiconductor overall. Specifically, it is desired that the layer of II-VI semiconductor is made not thicker than about 5 nm. When the layer of III-V semiconductor is made not thicker than about 10 nm, the ohmic characteristic can be obtained. When the device is applied to a head of an HDD, it is more preferable to make the compound layer 7 of III-V semiconductor not thicker than about 5 nm.

When about 1% or more of metal elements are added to semiconductor as impurities, a band gap based on electric resistance is practically zero no matter whether the semiconductor is a II-VI semiconductor or a III-V semiconductor. Thus, the semiconductor shows substantially the ohmic characteristic. In this event, the upper limit of the film thickness is defined from the point of view of resistance adjustment. However, it is preferable that the upper limit of the film thickness is about 5 nm or less. Also when an oxide semiconductor containing Fe, Cu, In, W, Ti, Pb, V, Bi, Nb, Zn, Ta, Sn, Zr or the like is used as the compound layer 7, it is preferable to make the film thickness not thicker than about 5 nm in order to obtain the ohmic characteristic.

On the other hand, the lower limit of the film thickness of the compound layer 7 has to be thick enough to form a uniform layer regardless of its material. Specifically, the compound layer 7 can be distributed uniformly if the film thickness thereof is 0.2 nm or more. In order to form the uniform layer more stably, it is desired that the film thickness is 0.5 nm or more.

When the compound layer 7 is a semiconductor, endothermic and exothermic reactions occur in the upper and lower interfaces thereof due to Peltier effect. Specifically, when the compound layer 7 is an n-type semiconductor, an endothermic reaction occurs in the interface which electrons enter, and an exothermic reaction occurs in the interface which electrons leave. Accordingly, there occurs a difference in temperature between the metal path 9 side and the magnetization pinned layer P side.

Heat is diffused more easily in the metal path 9 than in the magnetization pinned layer P. It is therefore desired that the current conduction direction is a direction in which the interface with the metal path is endothermic. In such a manner, the metal path 9 can be cooled by the Peltier effect. In the case of FIG. 1, it is desired that a current flows from the bottom to the top. On the other hand, when the compound layer 7 is a p-type semiconductor, an exothermic reaction occurs in the interface which electrons enter, and an endothermic reaction occurs in the interface which electrons leave. When a p-type semiconductor is used as the compound layer 7 in FIG. 1, it is desired to apply a current from the top to the bottom.

Examples of materials which show conductivity as half metal and available as the material of the compound layer 7 include graphite, $Fe_3O_4$, $CrO_2$, perovskite compounds, etc. In order to accelerate transmission of spin information of electrons cutting across this layer, it is desired that the upper limit of the film thickness is about 5 nm or less. On the other hand, the lower limit of the compound layer 7 has to be thick enough to form a uniform layer regardless of its material. The compound layer 7 can be distributed uniformly in accordance with the base and the film formation technique. Specifically, the compound layer 7 can be distributed uniformly if the film thickness thereof is 0.2 nm or more. In order to form the uniform layer more stably, it is desired that the film thickness is 0.5 nm or more. When the compound layer 7 configured thus is formed, diffusion in the interface between the metal path and the magnetic layer can be suppressed.

The compound layer 7 can be formed by a formation method such as molecular beam epitaxy (MBE), laser ablation, sputtering, CVD, etc. When the compound layer 7 is of oxide, nitride, fluoride, boride, carbide or the like, the compound layer 7 may be formed in such a manner that the surface of a metal layer formed in advance is exposed to reactive gas. CVD or MBE is generally used for forming a semiconductor. In the invention, however, extremely high purity is not requested. It is desired that the semiconductor contains impurities to reduce its resistance. Accordingly, it is important in the production method to give no adverse influence to the lower magnetic layer (layer 6 in FIG. 1). From this point of view, sputtering or the method in which the surface of a metal layer formed in advance is exposed to reactive gas is preferably selected as the production method.

Second Embodiment

A magnetoresistive device according to a second embodiment will be described with reference to FIG. 2 which is a schematic sectional view of the device.

Figure 2:
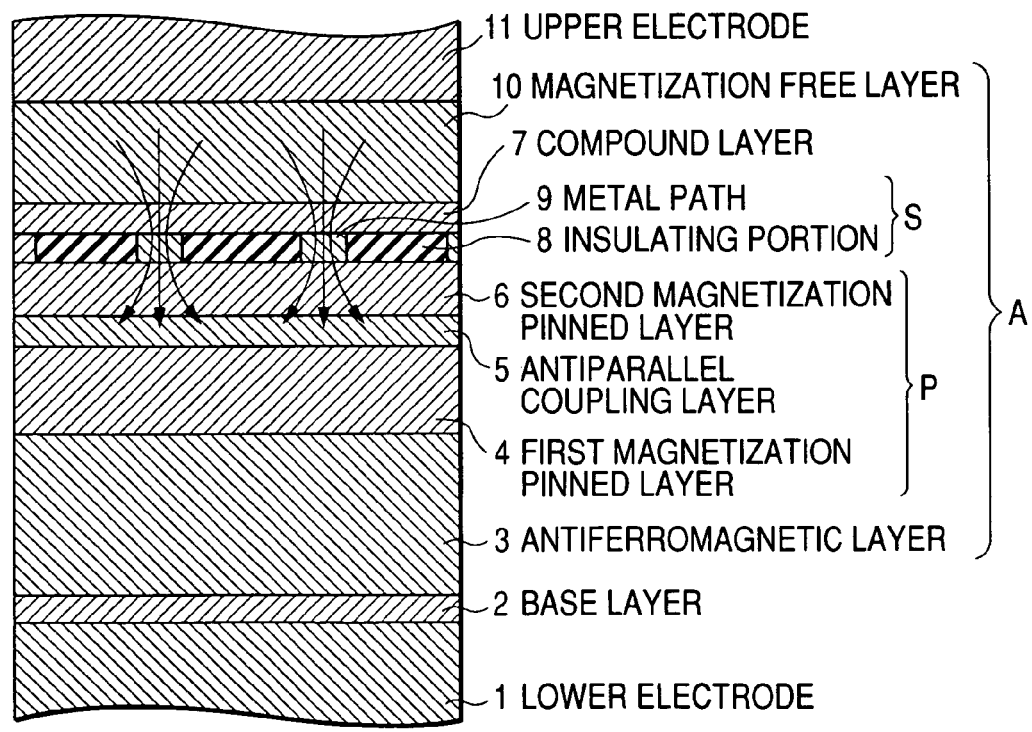
FIG. 2 is a schematic sectional view for explaining a magnetoresistive device according to a second embodiment.

In this embodiment, the compound layer 7 is formed on top of the metal path 9 and the insulating portion 8 as shown in FIG. 2. In this case, the compound layer 7 can suppress elementary diffusion between the metal path 9 and the magnetization free layer 10. When an n-type semiconductor is used as the compound layer 7, it is preferable that a current is applied from the bottom to the top in FIG. 2 so that the metal path can be cooled by the Peltier effect. When a p-type semiconductor is used as the compound layer 7, it is preferable that a current is applied from the top to the bottom in FIG. 2.

Third Embodiment A magnetoresistive device according to a third embodiment will be described with reference to FIG. 3 which is a schematic sectional view of the device.

Figure 3:
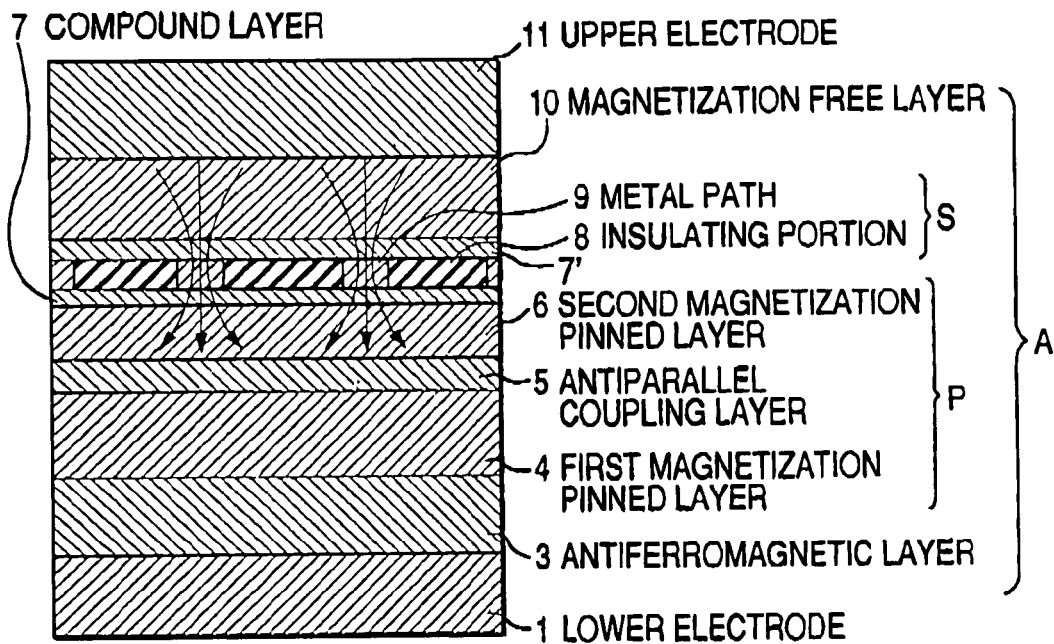
FIG. 3 is a schematic sectional view for explaining a magnetoresistive device according to a third embodiment.

In this embodiment, compound layers 7 and 7' are formed on top and bottom of the metal path 9 and the insulating portion 8 as shown in FIG. 3. In this case, it is possible to suppress diffusion in the interface between the metal path 9 and the magnetization free layer 10 and in the interface between the metal path 9 and the magnetization pinned layer 6.

Due to the configuration of the two compound layers 7 and 7', the resistance is increased. It is therefore necessary to reduce the film thicknesses of the compound layers 7 and 7'. Specifically, it is desired that the film thickness of each compound layer 7, 7' is about 4 nm or less.

When semiconductors are used for the compound layers 7 and 7', one of them is formed into an n-type and the other is formed into a p-type so that an endothermic reaction can be provided above and under the metal path 9. Thus, the cooling efficiency is improved as compared with that in the first and second embodiments.

Fourth Embodiment

A magnetoresistive device according to a fourth embodiment will be described with reference to FIG. 4 which is a schematic sectional view of the device.

Figure 4:
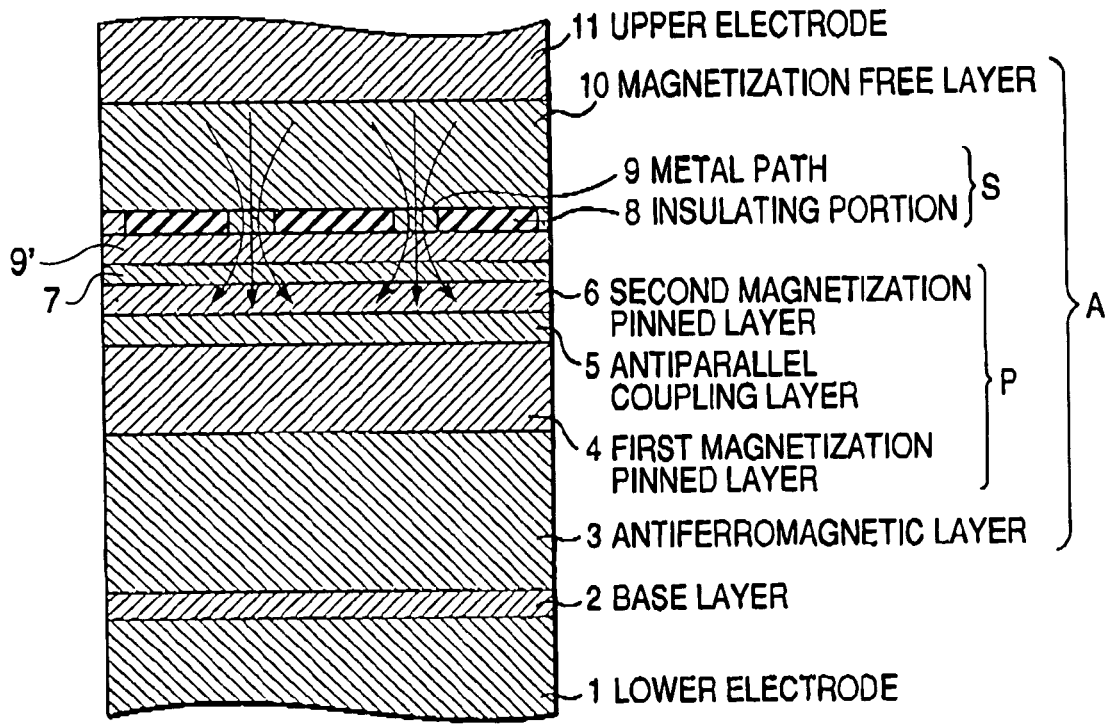
FIG. 4 is a schematic sectional view for explaining a magnetoresistive device according to a fourth embodiment.

In this embodiment, as shown in FIG. 4, a non-magnetic metal layer 9' is provided between the intermediate layer S and the compound layer 7. The non-magnetic metal layer 9' can be formed out of metal containing at least one kind of material selected from Cu, Au, Ag, Pt, Pd and Os as its main component in the same manner as the material of the metal path. If this non-magnetic metal layer 9' is absent, the compound layer 7 and the intermediate layer S will be formed contiguously between the magnetization pinned layer 6 and the magnetization free layer 10 so that the orientation or the growth of crystal grains in the magnetization free layer will be lost to some extent. When the non-magnetic metal layer 9' is formed, crystal growth once disturbed by the compound layer 7 can be adjusted. Thus, the film quality of the magnetization free layer 10 can be improved.

Also when the non-magnetic intermediate layer 9' is formed between the intermediate layer S and the compound layer 7 as shown in FIG. 4, the compound layer 7 may be formed in the upper interface of the metal path 9 or the compound layers 7 may be formed in the upper and lower interfaces of the metal path 9, as described in the second or third embodiment.

Fifth Embodiment

A magnetoresistive device according to a fifth embodiment will be described with reference to FIG. 5 which is a schematic sectional view of the device.

In the magnetoresistive device according to the fifth embodiment, the aforementioned metal path is formed partially only in the portions overlapping with the metal path 9. A material similar to that in the first embodiment is used. Due to this compound portion 7", it is possible to prevent elementary diffusion between the metal path 9 and the magnetization pinned layer 6. When the compound portion 7" is formed in the insulator 8 in the same manner as the metal path 9 as shown in FIG. 5, electrons can pass without any scattering due to quantum effect. Accordingly, it is possible to reduce the device resistance, while it is possible to reduce the percentage of the magnetoresistive effect impaired.

Consider the proper current conduction direction when the compound portion 7" is formed thus. As described previously, when a p-type semiconductor is used as the compound portion 7", an exothermic reaction occurs in the interface which electrons enter, and an endothermic reaction occurs in the interface which electrons leave. It is therefore desired that a current is applied from the upper electrode 11 to the lower electrode 1 in FIG. 5. When an n-type semiconductor is used as the compound portion 7", it is desired that a current is applied from the lower electrode 1 to the upper electrode 11.

Figure 5:
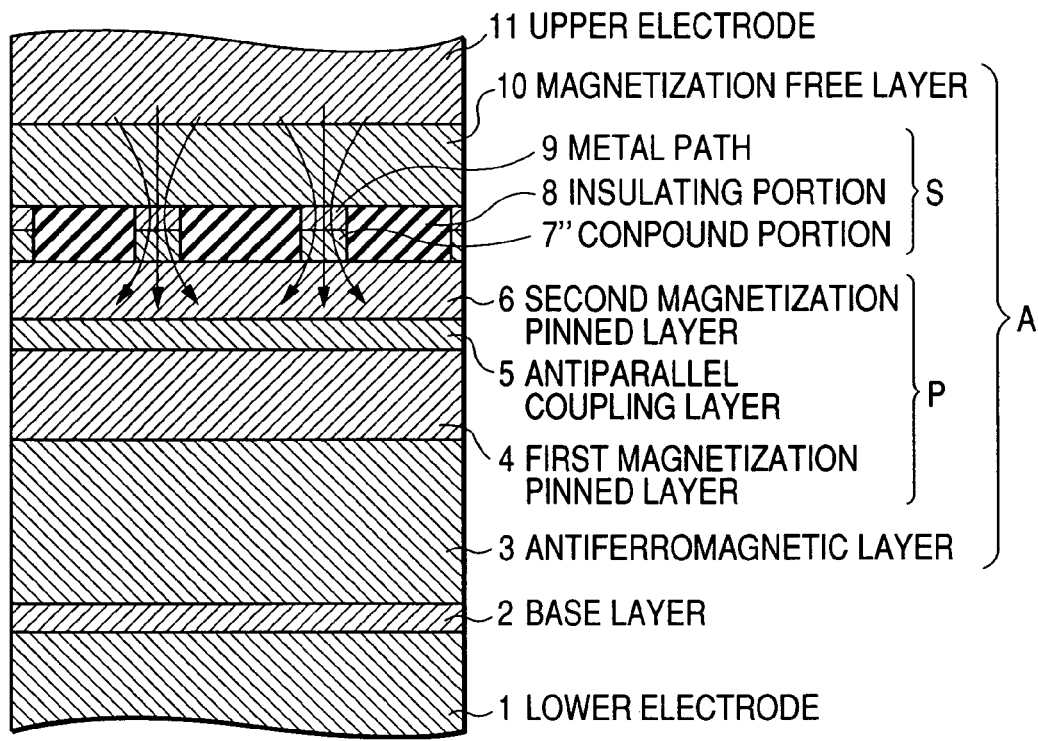
FIG. 5 is a schematic sectional view for explaining a magnetoresistive device according to a fifth embodiment.
Figure 6:
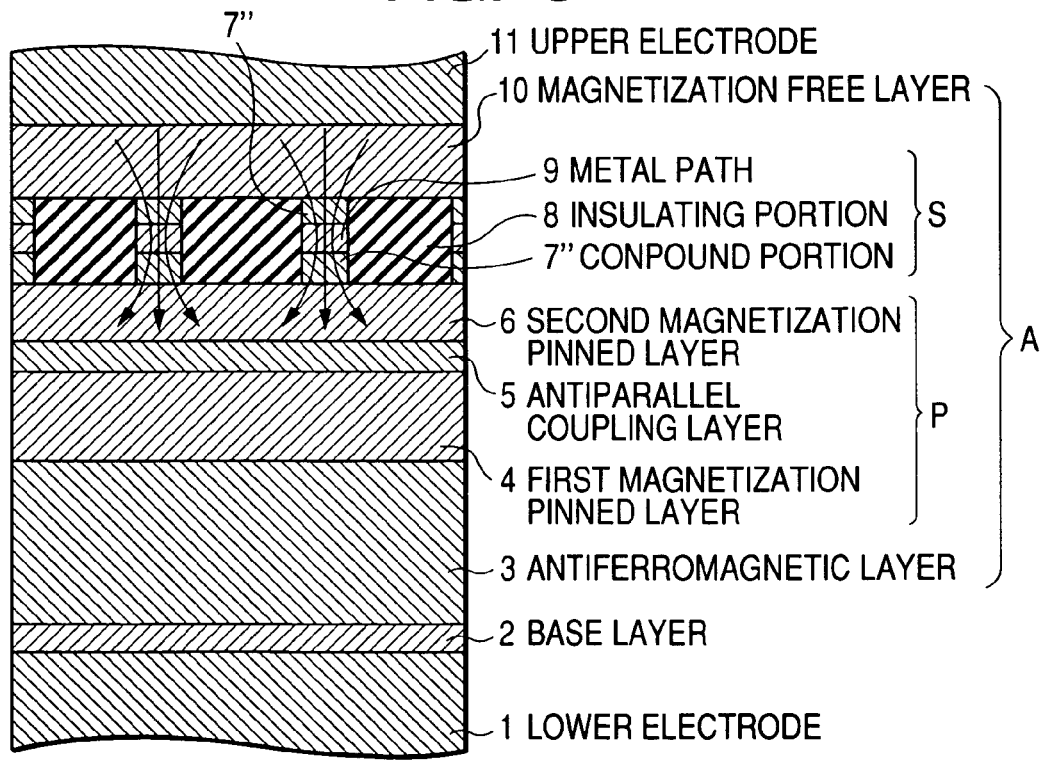
FIG. 6 is a schematic sectional view for explaining the magnetoresistive device according to the fifth embodiment.

The compound portion 7" formed partially as shown in FIG. 5 may be formed on top of the metal path 9 or on top and bottom of the metal path 9 (see the schematic sectional view of FIG. 6) as described in the second or third embodiment. The metal in this case may be selected with reference to the materials available for the compound layer 7.

Figure 7:
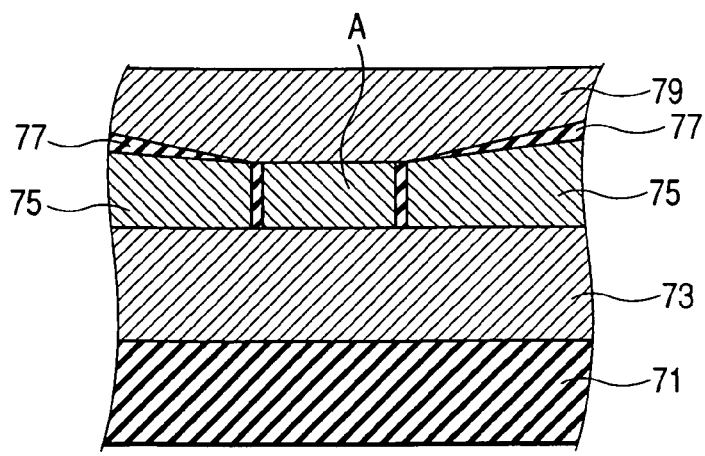
FIG. 7 is a schematic sectional view showing a sense portion of a magnetic reproducing head to which a magnetoresistive device according to any one of the first to fifth embodiments has been applied.

The magnetoresistive device described above can be used as a sense portion of a magnetic reproducing head. FIG. 7 is a schematic sectional view of a sense portion formed on a substrate (head slider) 71. The section shown in FIG. 7 is a section substantially parallel to a medium-opposed surface (ABS: Air Bearing Surface). The left/right direction of the paper of FIG. 7 corresponds to the track width direction of a magnetic recording medium.

The second magnetization pinned layer 6 of the magnetoresistive film A has magnetization pinned. The direction of the magnetization is perpendicular to the paper of FIG. 7. The magnetization free layer 10 has magnetization stabilized in the left/right direction of the paper of FIG. 7. The direction of the magnetization of the magnetization free layer 10 can be changed in accordance with a magnetic field applied from the medium perpendicularly to the paper. The magnetization of the magnetization free layer 10 is stabilized by a hard magnetic layer 75. The hard magnetic layer 75 is formed to hold the magnetoresistive film A from either side in the track width direction of the sense portion. The lower electrode 1 and the upper electrode 11 may also serve as upper and lower shields 73 and 79 respectively, or the upper and lower shields 73 and 79 may be formed separately. The shields 73 and 79 are, for example, made of magnetic films of an NiFe alloy or the like.

EXAMPLE 1

Description will be made on a magnetoresistive device according to Example 1.

Example 1 had the following laminated structure. Intended thickness to be formed by sputtering and a material will be shown for each layer. 5 nm—Ta/2 nm—Ru/15 nm—PtMn/4 nm—CoFe/1 nm—Ru/4 nm—FeCo/(compound layer7)/(intermediate layer S)/1 nm—FeCo/3 nm—NiFe/1 nm—Cu/10 nm—Ru Ta and Ru formed a base layer 2, Cu and Ru formed cap layers. The magnetization free layer 10 was a laminated film of FeCo and NiFe.

In order to form the compound layer 7 and the intermediate layer S, layers of 1 nm—$Fe_2O_3$/0.5 nm—Cu/ AlCu-oxide/0.5 nm—Cu are formed. The $Fe_2O_3$ layer corresponds to the compound layer 7. The metal path 9 was formed by oxidizing an AlCu alloy formed on Cu. Due to a self-assembling process based on oxidization, the metal path 9 of Cu could be formed in the AlCu oxide.

In Example 1, the magnetoresistive change rate (MR) was about 10%, and the resistance (RA) per area was 420 m$\Omega\mu m^2$. As Comparative Example 1, a device was produced in the configuration in which no compound layer 7 was used, and an <intermediate layer> was formed out of 0.5 nm—Cu/AlCu-oxide/0.5 nm—Cu. In Comparative Example 1, film properties of about 12% in MR and about 350 m$\Omega\mu m^2$ in RA are obtained.

Figure 8:
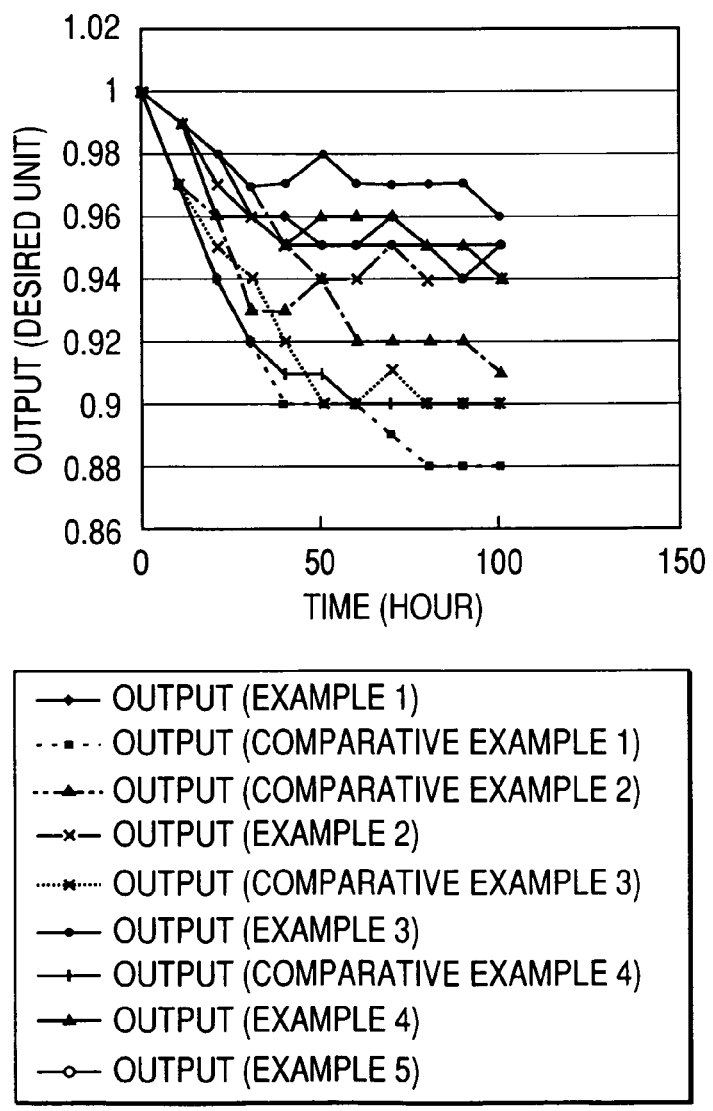
FIG. 8 is a graph showing results of Examples of the invention and Comparative Examples.

Devices having the structure of FIG. 7 are produced using these films respectively, and an accelerated test (0-150 hours) to apply a load heavier than in ordinary use was carried out on these films. As for the load conditions, the voltage was 150 mV, and the current conduction direction was a direction from the lower electrode 73 to the upper electrode 79 (defined as "negative conduction"). The environmental temperature was 130 degrees centigrade. The results are shown in FIG. 8. Apparently good stability was obtained in the structure of Example 1.

Comparative Example 2 shows a result of an accelerated test carried out on the load conditions that the voltage was 150 mV, the current conduction direction was a direction from the upper electrode to the lower electrode (defined as "positive conduction") , and the environmental temperature was 130 degrees centigrade. Comparative Example 2 shows a better result than Comparative Example 1, but shows great degradation as compared with the configuration of Example 1. This is because $Fe_2O_3$ is an n-type semiconductor so that an endothermic reaction occurs on the metal path side in negative conduction while an exothermic reaction occurs on the metal path side in positive conduction.

EXAMPLE 2

Description will be made on a magnetoresistive device according to Example 2. The device in Example 2 had a layer structure similar to that in Example 1, except the compound layer 7 and the intermediate layer S.

In order to form the compound layer 7 and the intermediate layer S, layers of 1 nm—$Cu_2O$/0.5 nm—Cu/AlCu-oxide/0.5 nm—Cu are formed. The metal path 9 was formed in the same manner as in Example 1. In this configuration, film properties of about 9.7% in MR and about 410 m$\Omega\mu m^2$ in RA are obtained. The layer of $Cu_2O$ corresponds to the compound layer 7.

An accelerated test was carried out on the load conditions of 150 mV in voltage (positive conduction) and 130 degrees centigrade in environmental temperature. The result of the accelerated test is shown in FIG. 8. Comparative Example 3 plotted together shows a result of an accelerated test (0-150 hours) carried out in the configuration of Example 2 on the conditions of 150 mV in voltage (negative conduction) and 130 degrees centigrade in environmental temperature.

Both Example 2 and Comparative Example 3 show better results than Comparative Example 1. However, a difference caused by the difference in current conduction direction was observed obviously. This is because an endothermic reaction occurs on the metal path side in positive conduction due to $Cu_2O$ which is a p-type semiconductor.

EXAMPLE 3

Description will be made on a magnetoresistive device according to Example 3. The device in Example 3 had a layer structure similar to that in Example 1, except the compound layer and the intermediate layer.

In order to form the compound layers 7 and 7' and the intermediate layer S, layers of 0.5 nm—$Cu_2O$/0.5 nm—Cu/AlCu-oxide/0.5 nm—Cu/0.5 nm—$Fe_2O_3$ are formed. The metal path 9 was formed in the same manner as in Example 1. The layer of $Cu_2O$ corresponds to the compound layer 7, and $Fe_2O_3$ corresponds to the compound layer 7'.

In this configuration, film properties of 11% in MR and 430 m$\Omega\mu m^2$ in RA are obtained. An accelerated test was carried out on the conditions of 150 mV in voltage (positive conduction) and 130 degrees centigrade in environmental temperature in this configuration. The result of the accelerated test is shown in FIG. 8 (Example 3).

Comparative Example 4 plotted together shows a result of an accelerated test (0-150 hours) carried out in the same configuration on the conditions of 150 mV in voltage (negative conduction) and 130 degrees centigrade in environmental temperature (Comparative Example 4). The result of the positive conduction shows very good stability, while the result of the negative conduction in Comparative Example 4 shows a result almost the same as Comparative Example 2. This is because both the upper and lower interfaces of the metal path 9 are exothermic.

EXAMPLE 4

Description will be made on a magnetoresistive device according to Example 4. The device in Example 4 had a layer structure similar to that in Example 1, except the compound layer and the intermediate layer.

In Example 4, in order to form the intermediate layer S including the compound layer 7" as shown in FIG. 5, layers of 1 nm—AlFe-oxide/AlCu-oxide/0.5 nm—Cu are formed. The intermediate layer S was formed in the following production method. After an AlFe alloy layer was formed, an AlCu layer was formed. After that, oxygen was supplied in a plasma state or a radical state. Alternatively, the surfaces of the layers are irradiated with rare gas ions while the surfaces are exposed to oxygen gas so as to be oxidized. In Example 4, the intermediate layer S was formed in the method in which the surfaces are irradiated with rare gas ions while the surfaces are exposed to oxygen gas. In such a manner, a path having $Fe_2O_3$ and Cu laminated in Al oxide could be formed.

As a result, film properties of 11.5% in MR and 370 m$\Omega\mu m^2$ in RA are obtained in the configuration. The properties are initial properties almost the same as in Comparative Example 1, and increase in resistance could be suppressed to be lower. An accelerated test (0-150 hours) was carried out in this configuration on the conditions of 150 mV in voltage (positive conduction) and 130 degrees centigrade in environmental temperature. The result of the accelerated test is shown in FIG. 8 (Example 4). Also in this case, stability substantially as good as that in Example 1 could be obtained.

EXAMPLE 5

Description will be made on a magnetoresistive device according to Example 5. The device in Example 5 had a layer structure similar to that in Example 1, except the compound layer 7 and the intermediate layer S.

In order to form the compound layer 7 and the intermediate layer S, layers of 0.5 nm—Fe3O4/0.5 nm—Cu/ AlCu-oxide/ 0.5 nm—Cu are formed. The $Fe_3O_4$ layer corresponds to the compound layer 7. In this case, film properties of 12% in MR and 360 m$\Omega\mu m^2$ in RA are obtained. Due to the metal phase of Fe3O4, increase in resistance was suppressed, while MR was not lowered.

In this configuration, an accelerated test (0-150 hours) was carried out on the conditions of 150 mV in voltage (positive conduction) and 130 degrees centigrade in environmental temperature. The result of the accelerated test is shown in FIG. 8 (Example 5). Also in this case, stability substantially as good as in Example 1 could be obtained.

As has been described above, due to a lamination of a compound layer on a metal path, good stability can be obtained. A result substantially similar to such improvement can be obtained by use of another compound.

The magnetoresistive devices and magnetic reproducing heads as descried in the above may be applied for use in a magnetic recording and reproducing apparatus, such as a hard disk drive unit, by being built into a magnetic head assembly of a recording/reproducing integrated type.

Figure 9:
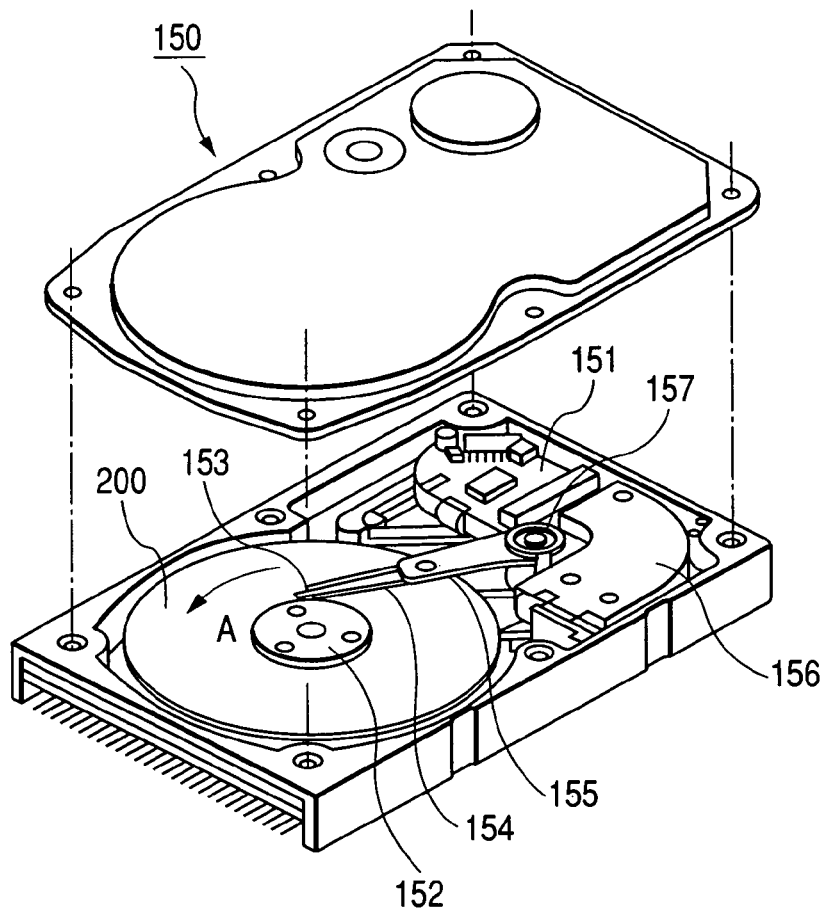
FIG. 9 is a perspective view showing an overview of a hard disk drive unit.

FIG. 9 is a perspective view showing an overview of a hard disk drive unit. The hard disk drive unit 150 is a configured as a type having a rotary actuator. As shown in FIG. 9, the hard disk drive unit 150 has a magnetic disk 200 as an information recording medium. The magnetic disk 200 is attached to a spindle 152 and is rotated in a direction shown by an arrow A by a motor (not shown) that is driven in accordance with a control signal input from a controller 151. Although only one magnetic disk 200 is shown in FIG. 9, the hard disk drive unit 150 maybe provided with a plurality of magnetic disks.

The hard disk drive unit 150 has a head slider 153 that records and reproduces information to and from the magnetic disk 200. The head slider 153 is attached on the leading edge of a suspension 154 that is formed by a thin metal sheet. On the head slider 153, there is mounted one of the magnetoresistive devices and magnetic reproducing heads as descried in the foregoing embodiments and examples.

When the magnetic disk 200 is rotated, a medium-opposed surface (ABS: Air Bearing Surface) of the head slider 153 floats above the magnetic disk 200 and maintains a predetermined floating height therefrom. However, the head slider 153 may be configured as a so-called contact sliding type in which the head slider slides on the magnetic disk 200 in a contacted state.

The suspension 154 is attached to an end portion of an actuator arm 155 that is provided with a bobbin portion that retains an actuator coil (not shown). A voice coil motor 156, which is one kind of a liner motor, is provided at the other end portion of the actuator arm 155. The voice coil motor 156 includes the actuator coil and a magnetic circuit having a permanent magnet and an opposing yoke being disposed to oppose with each other and sandwich the actuator coil.

The actuator arm 155 is rotatably supported by ball bearings that is disposed at lower and upper portions of the spindle 157, and is rotatably moved by the voice coil motor 156.

Figure 10:
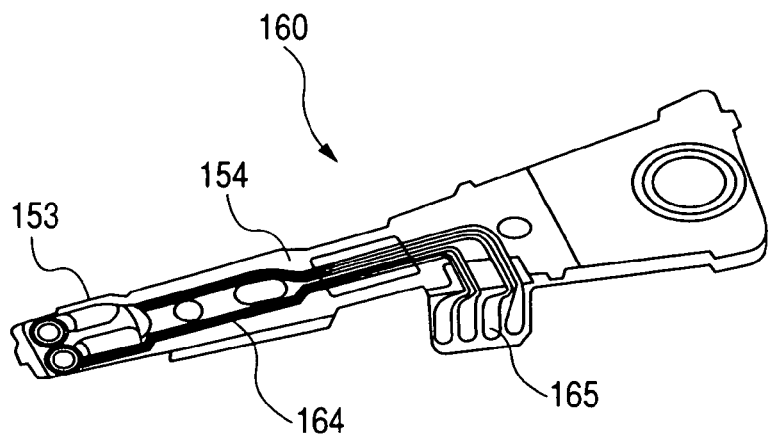
FIG. 10 is a perspective view showing a part of the magnetic head assembly.

FIG. 10 is a perspective view showing a part of the magnetic head assembly 160 which is provided beyond the actuator arm 155. The magnetic head assembly 160 has the actuator arm 155 that is provided with the bobbin portion that retains the actuator coil. The suspension 154 is attached to the leading edge of the actuator arm 155.

At the leading edge of the suspension 154, there is attached the head slider 153 that is provided with either one of the magnetoresistive devices and magnetic reproducing heads as descried in the foregoing description. The suspension 154 is provided with lead wires 164 that is electrically connected to each of the terminals of the magnetic head that is mounted on the head slider 153. The other end of the lead wires 164 are connected to terminal pads 165.

As described above, the hard disk drive unit 150 thus configured is provided with either one of the magnetoresistive devices and magnetic reproducing heads as descried in the foregoing embodiments and examples. According to the configuration, the hard disk drive unit 150 becomes capable of reliably reading information recorded on the magnetic disk 200 in higher recording density compared to a conventional recording density.

As described in the above with reference to the embodiments and examples, the magnetoresistive devices according to the invention can be used as reproducing devices. in magnetic reproducing heads of magnetic information reproducing apparatus. The magnetic information reproducing apparatus is, for example, a hard disk unit.

According to the configurations as descried in the embodiments and examples, the thermal stability of a current-confined type magnetoresistive device is improved so that the long-term reliability is improved. In addition, the reliability in a magnetic reproducing head and a magnetic information reproducing apparatus is improved.

The foregoing description of the embodiments has been presented for purposes of illustration and description. It is not intended to be exhaustive or to limit the invention to the precise form disclosed, and modifications and variations are possible in light of the above teachings or may be acquired from practice of the invention. The embodiment is chosen and described in order to explain the principles of the invention and its practical application program to enable one skilled in the art to utilize the invention in various embodiments and with various modifications as are suited to the particular use contemplated. It is intended that the scope of the invention be defined by the claims appended hereto, and their equivalents.

What is claimed is:

1. A magnetoresistive device comprising:
a magnetoresistive film; and
a pair of electrodes electrically connected to upper and lower film surfaces of the magnetoresistive film,
wherein the magnetoresistive film comprises:
a magnetization pinned film including a first ferromagnetic layer having magnetization substantially pinned in one direction;
a magnetization free film including a second ferromagnetic layer whose magnetization rotates in accordance with an external magnetic field;
an intermediate layer formed between the magnetization pinned film and the magnetization free film, the intermediate layer including
an insulating film , and
a columnar metal conduction portion formed within the insulating film to provide electrical conductivity between the magnetization pinned film and the magnetization free film; and
a compound layer that is formed between the metal conduction portion and at least one of the magnetization pinned film and the magnetization free film, the compound layer including a compound having at least one of an electrovalent-bound characteristic and a covalently-bound characteristic.

2. The magnetoresistive device according to claim 1, wherein the compound layer is uniformly formed between the intermediate layer and at least one of the magnetization pinned film and the magnetization free film.

3. The magnetoresistive device according to claim 2, further comprising a non-magnetic metal layer formed between the intermediate layer and the compound layer.

4. The magnetoresistive device according to claim 1, wherein the compound layer is formed within the insulating film.

5. The magnetoresistive device according to claim 1, wherein the metal conduction portion occupies 50% or less of a film surface of the intermediate layer.

6. The magnetoresistive device according to claim 1, wherein the compound is a material selected from III-V semiconductors, II-VI semiconductors, and oxide semiconductors including Fe, Cu, In, W, Ti, Pb, V, Bi, Nb, Zn, Ta, Sn and Zr.

7. The magnetoresistive device according to claim 1, wherein the compound is an n-type semiconductor, and a sense current supplied from the pair of electrodes flows from the compound to the metal conduction portion.

8. The magnetoresistive device according to claim 1, wherein the compound includes at least one selected from oxides of Fe, Cu, In, W, Ti, Pb, V, Bi, Nb, Zn, Ta, Sn and Zr, and a sense current supplied from the pair of electrodes flows from the compound to the metal conduction portion.

9. The magnetoresistive device according to claim 1, wherein the compound is a p-type semiconductor, and a sense current supplied from the pair of electrodes flows from the metal conduction portion to the compound.

10. A magnetic reproducing head comprising:
a head slider that includes a surface that faces a recording medium; and
the magnetoresistive device according to claim 1, provided on the surface of the head slider to reproduce information recorded on the recording medium.

11. A magnetic information reproducing apparatus comprising:
a information recording medium on which magnetic information is recorded; and
a magnetic reproducing head that reproduces the magnetic information recorded on the information recording medium,
wherein the magnetic reproducing head comprises:
a head slider that includes a surface that faces a recording medium; and
the magnetoresistive device according to claim 1, provided on the surface of the head slider to reproduce information recorded on the recording medium.

* * * * *